United States Patent [19]

Nakamura

[11] Patent Number: 5,513,344
[45] Date of Patent: Apr. 30, 1996

[54] METHOD OF TESTING CACHE MEMORIES USED FOR AN INFORMATION PROCESSING APPARATUS

[75] Inventor: Norihisa Nakamura, Tokyo, Japan

[73] Assignee: NEC Corporation, Japan

[21] Appl. No.: 332,082

[22] Filed: Nov. 1, 1994

[30] Foreign Application Priority Data

Nov. 10, 1993 [JP] Japan .................................. 5-280791

[51] Int. Cl.⁶ ..................................................... G06F 11/00
[52] U.S. Cl. ................................ 395/185.18; 395/185.07
[58] Field of Search ..................................... 395/575, 471,
395/472, 481, 425, 183.18, 185.07, 185.06,
185.02; 371/21.1, 21.2, 21.5

[56] References Cited

U.S. PATENT DOCUMENTS

| | | | |
|---|---|---|---|
| 5,003,506 | 3/1991 | Itaya | 371/21.1 |
| 5,247,653 | 9/1993 | Hung | 395/500 |
| 5,276,832 | 1/1994 | Holman, Jr. | 395/425 |

*Primary Examiner*—Robert W. Beausoliel, Jr.
*Assistant Examiner*—Joseph E. Palys
*Attorney, Agent, or Firm*—Whitham, Curtis, Whitham & McGinn

[57] ABSTRACT

In a cache memory test method for an information processing apparatus, data for testing cache memories is set in a main memory such that data values of the data have regularity. The data is loaded from the main memory into each of the cache memories. The data is equal or larger in amount than the capacity of each of the cache memories. Information indicating a cache hit indicating that the data is read out from one of the cache memories when the main memory is accessed to read out the data therefrom, or information indicating a cache mishit indicating that the data is not read out from any one of the cache memories is recorded to form a cache hit/mishit information table. Whether each of the cache memories is in a normal/abnormal condition is determined from the state of occurrence of cache hits and cache mishits indicated by the cache hit/mishit information table. Whether each of the cache memories is in a normal/abnormal condition is determined by checking, on the basis of the regularity, correctness of a data value with respect data for which a cache hit is determined in the third step. The capacity of each of the cache memories is determined on the basis of the amount of data for which cache hits are determined.

4 Claims, 4 Drawing Sheets

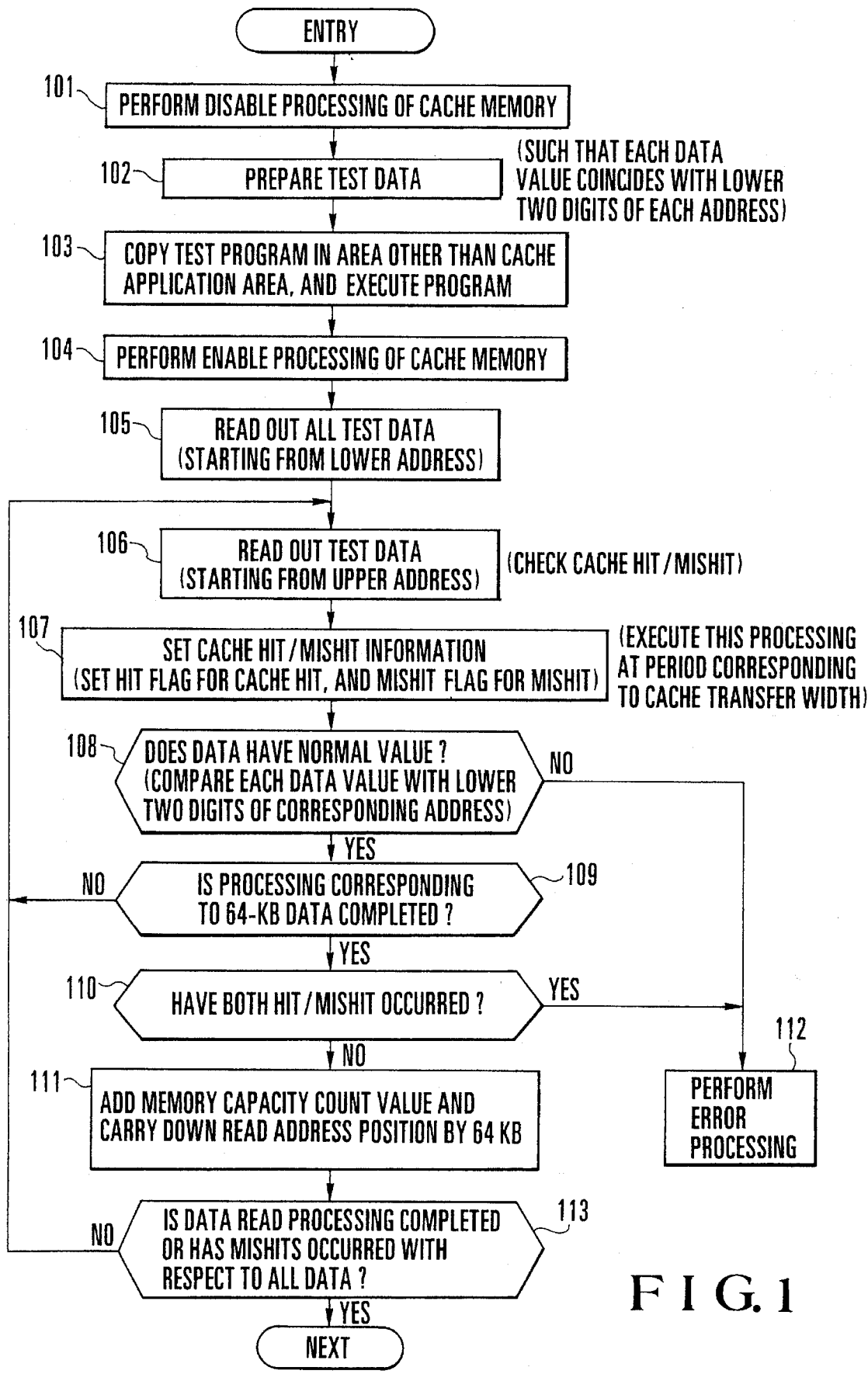
F I G. 1

METHOD OF TESTING CACHE MEMORIES USED FOR AN INFORMATION PROCESSING APPARATUS

BACKGROUND OF THE INVENTION

The present invention relates to a method of testing cache memories and, more particularly, to a method of testing cache memories used for an information processing apparatus in which cache memories having different capacities can be mounted.

In general, in an information processing apparatus in which a cache memory can be mounted, in order to guarantee a normal operation, self-diagnosis is performed upon a power-on operation. In this case, a test is performed to check whether the mounted cache memory operates properly.

FIG. 3 shows the cache memory portion of an information processing apparatus in which a cache memory is mounted. FIG. 4 shows processing in this conventional cache memory test method. FIG. 4 shows a portion of the flow chart for self-diagnosis of this information processing apparatus.

As a cache memory, a memory element which operates faster than a main memory is used. This cache memory serves to store copies of frequently accessed data from the main memory and exchange data at a high speed in place of the main memory. A cache memory is generally faster than a main memory but has a small memory capacity.

Referring to FIG. 3, when a CPU 301 generates a request to read data from a main memory 303, the CPU 301 accesses a cache memory 302 first. If the data can be read out ("a cache hit occurs"), the readout data is used. If, however, the data cannot be read out ("a mishit occurs"), the CPU 301 reads out the data from the main memory 303 and uses it. When the data is read out from the main memory 303, it is simultaneously written in the cache memory 302. A cache mishit determining circuit 304 monitors a data write operation with respect to the cache memory 302 to determine the presence/absence of a cache mishit. Referring to FIG. 3, the solid lines indicate the flows of data in the occurrence of a cache hit, and the broken lines indicate the flows of data in the occurrence of a cache mishit.

As data is sequentially written from the main memory 303 into the cache memory 302 upon cache mishits, the cache memory 302 is eventually filled to capacity. After the cache memory 302 becomes full, new data is overwritten on previously written data, thus erasing the old data.

A conventional cache memory test method will be described next with reference to FIG. 4. The same circuit as that shown in FIG. 3 is used.

The conventional cache memory test method is capable of testing two cache memories having different capacities. In this case, two cache memories having capacities of 64 and 128 kilobytes (KB) are mounted in the information processing apparatus to be described in this prior art.

Referring to FIG. 4, in step 401, cache disable processing is performed to inhibit the operation of the cache memory 302. In step 402, test data preparation is performed to cause the main memory 303 to store test data for testing the cache memory 302. As this test data, 128-KB data is formed, which corresponds to the largest capacity of the capacities of the cache memories to be tested.

This test data is set to have regularity in such a manner that each data value coincides with the lower two digits of a corresponding address. For example, a data value "00H" is set for address "10000H". Similarly, "01H" is set for "10001H", ..., "FFH" for "100FFH", "00H" for "10100H", ..., "FFH" for "1FFFFH".

In step 403, a test program is copied onto an area other than the cache application area and executed. More specifically, when the CPU 301 accesses the main memory 303, no access to a cache memory is performed in a certain area (an area other than the cache application area) of the main memory. The test program for executing a test is copied in such an area of the main memory 303, i.e., the area other than the cache application area. With this operation, when the test program is read out, the program is not written in a cache memory, thereby preventing data other than test data from being unintentionally written in a cache memory. The program to be executed by the CPU 301 is switched from the currently executed program to the program copied in the area other than the cache application area.

In step 404, cache enable processing is performed to enable the cache memory which has been set in an disabled state. In step 405, all test data is written. That is, the test data is read out from the main memory 303, and all the 128-KB data is written in the cache memory 302, starting from the lower address.

As shown in FIG. 5, when the 128-KB cache memory is used, all the test data is written in the cache memory. If, however, the 64-KB cache memory is used, only 64-KB test data at upper addresses is written in the cache memory. Assume that the 64-KB cache memory is mounted in the information processing apparatus. In this case, when 64-KB test data at lower addresses is read out from the main memory and written in the cache memory, the cache memory is filled to capacity. As the next data is written, the previously written data is sequentially erased upon an overwrite operation. Therefore, when data at addresses corresponding 128 KB is written, only 64-KB test data corresponding to the upper addresses is written in the cache memory.

In step 406, a test data read operation is performed to access the main memory to read out 64-KB test data corresponding to the lower addresses ("10000H" to "1FFFFH" in FIG. 5). The cache mishit determining circuit 304 then checks whether a cache hit or a cache mishit has occurred with respect to each data.

In this case, a data read/write operation based on the program is performed with respect to the main memory 303. When access to the main memory 303 is made, the cache memory 302 is accessed automatically in a hardware manner. The test on the cache memory 302 is performed by using this operation.

In step 407, it is checked whether cache hits have occurred with respect to the all the data. If YES in step 407, it is determined that the capacity of the cache memory is 128 KB. If NO in step 407, it is checked whether cache mishits have occurred with respect to all the data. If YES in step 408, it is determined that the capacity of the cache memory is 64 KB. If NO in step 408, it means that both cache hits and mishits have occurred. In this case, there is a high possibility that a memory failure, a data error, or the like has occurred. Therefore, it is determined that the cache memory has failed. In step 414, error processing is performed.

When a cache mishit occurs with respect to the test data read out from the main memory 303, the data is written in the cache memory not in units of addresses but at a period corresponding to a predetermined cache transfer width. Therefore, when the test data is to be read out, start byte data is read out at the period corresponding to the cache transfer width.

The cache transfer width is the amount of data transferred to the cache memory when a cache mishit occurs. Assume that the cache transfer width is 16 bytes. In this case, when a cache mishit occurs in reading data at address "1000H", data at addresses "1000H" to "1000FH", which corresponds to 16 bytes from the address at which the cache mishit has occurred, is copied in the cache memory. As is apparent, when data at the next address "1001H" is checked, since the data has already been written, a cache hit is determined. Therefore, no check on the data is required.

If YES in step 407, the cache memory mounted in the apparatus is the 128-KB cache memory. In step 409, a test data read operation is performed to read out 128-KB test data again from the main memory, starting from the lower address. The data is written in the cache memory, thereby setting the data in the cache memory again.

Similarly, if YES in step 408, the cache memory mounted in the apparatus is the 64-KB cache memory. In step 410, a test data read operation is performed to read out 64-KB test data again from the main memory, starting from the lower address. The data is written in the cache memory, thereby setting the data in the cache memory again.

In step 411, a test data read operation is performed to read out the 128- or 64-KB data again, which is written in the cache memory in step 409 or 410, from the lower address. In step 412, it is checked whether cache hits have occurred with respect to all the data. If YES in step 412, it is checked in step 413 whether all the data have normal values. If YES in step 413, it is determined that the cache memory is normal.

Note that whether all the data have normal values can be easily determined because the data is set to have regularity in such a manner that each data value coincides with the lower two digits of each address.

If NO is obtained in step 412 or 413 because a cache mishit has occurred or readout data is not normal, error processing is performed in step 414.

In the conventional cache memory test method described above, a test can be performed only when cache memories which can be mounted in an information processing apparatus have two different capacities. For this reason, if cache memories mounted in the information processing apparatus have three or more different capacities upon exchanging or addition of cache memories, a cache memory test cannot be performed.

SUMMARY OF THE INVENTION

The present invention has been made to solve the above conventional problem, and has as its object to provide a cache memory test method which can perform a cache memory test regardless of the capacities of cache memories mounted in an information processing apparatus.

It is another object of the present invention to provide a cache memory test method which can perform a cache memory test without arranging signal lines indicating that cache memories are mounted or changing mechanical switches such as jumper strap switches in accordance with the capacities of memories.

In order to achieve the above objects, according to the present invention, there is provided a cache memory test method for an information processing apparatus including a main memory, a plurality of cache memories which have different memory capacities and are accessed at the same time when the main memory is accessed, and a determining circuit for, when data is read out from the main memory, determining a cache hit indicating that the data is read out from one of the cache memories, or a cache mishit indicating that the data is not read out from any one of the cache memories, comprising the first step of setting data for testing the cache memories in the main memory such that data values of the data have regularity, the second step of loading the data from the main memory into each of the cache memories, the data being not less in amount than the capacity of each of the cache memories, the third step of recording information indicating a cache hit indicating that the data is read out from one of the cache memories when the main memory is accessed to read out the data therefrom, or information indicating a cache mishit indicating that the data is not read out from any one of the cache memories, thereby forming a cache hit/mishit information table, the fourth step of determining a normal/abnormal condition of each of the cache memories from a state of occurrence of cache hits and cache mishits indicated by the cache hit/mishit information table, the fifth step of determining a normal/abnormal condition of each of the cache memories by checking, on the basis of the regularity, correctness of a data value with respect to readout data for which a cache hit is determined in the third step, and the sixth step of determining the capacity of each of the cache memories on the basis of an amount of data for which cache hits are determined in the third step.

Assume that test data is read out in units of 64 KB, and cache hit/mishit checks are performed. In this case, when cache mishits occur in all checks on the next 64-KB data, it is determined that the memory capacity of the cache memory mounted in the information processing apparatus is 64 KB. If cache mishits occur in all checks on the next 64-KB data, it is determined that the memory capacity of the cache memory is 128 KB. Similarly, the memory capacities of cache memories, e.g., 256 KB and 512 KB, can be determined.

BRIEF DESCRIPTION OF THE DRAWINGS

FIG. 1 is a flow chart showing processing in a cache memory test according to an embodiment of the present invention;

DESCRIPTION OF THE PREFERRED EMBODIMENT

Figure 3:
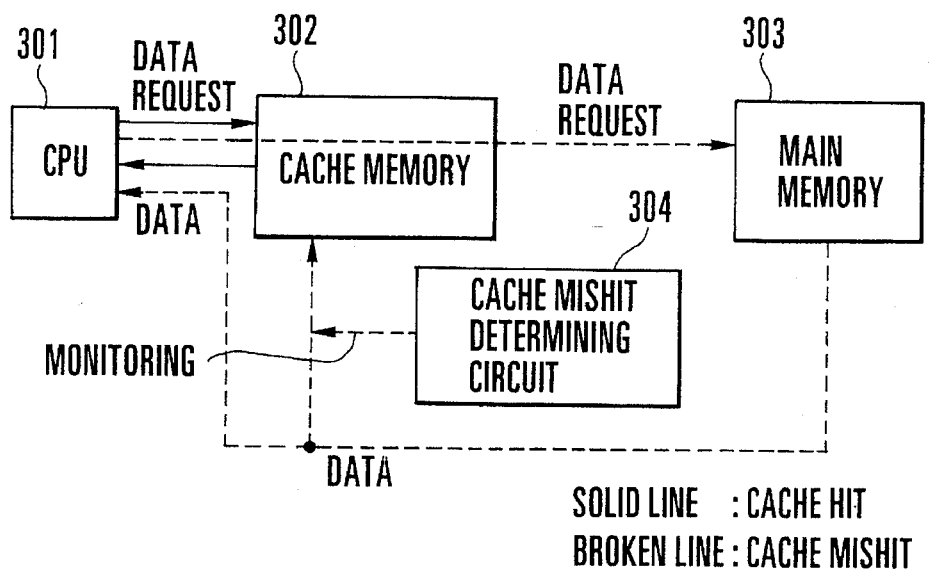
FIG. 3 is a block diagram showing the arrangement of an information processing apparatus in which cache memories, to which the present invention is applied, are mounted.
Figure 4:
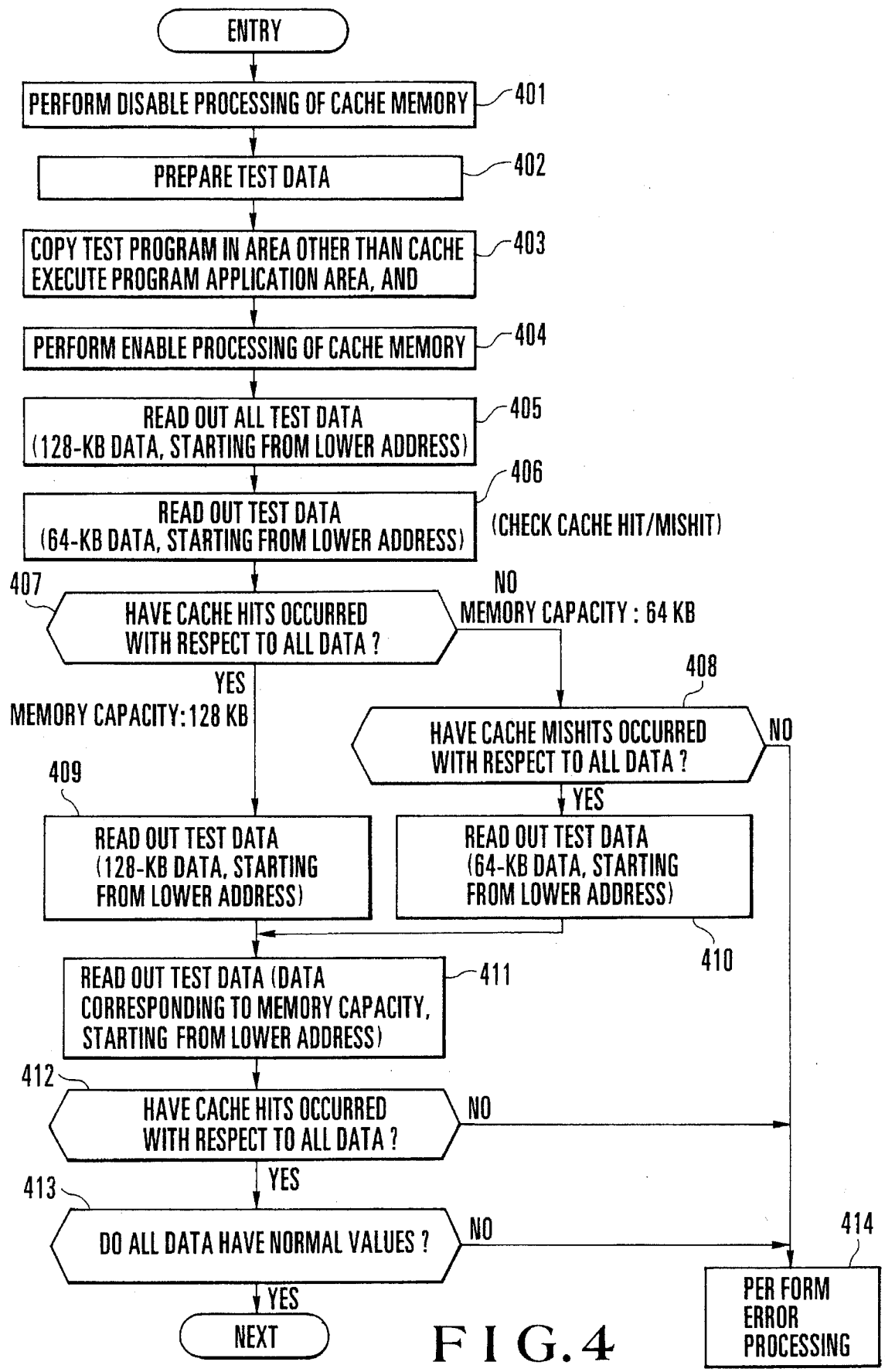
FIG. 4 is a flow chart showing processing in a conventional cache memory test method.
Figure 5:
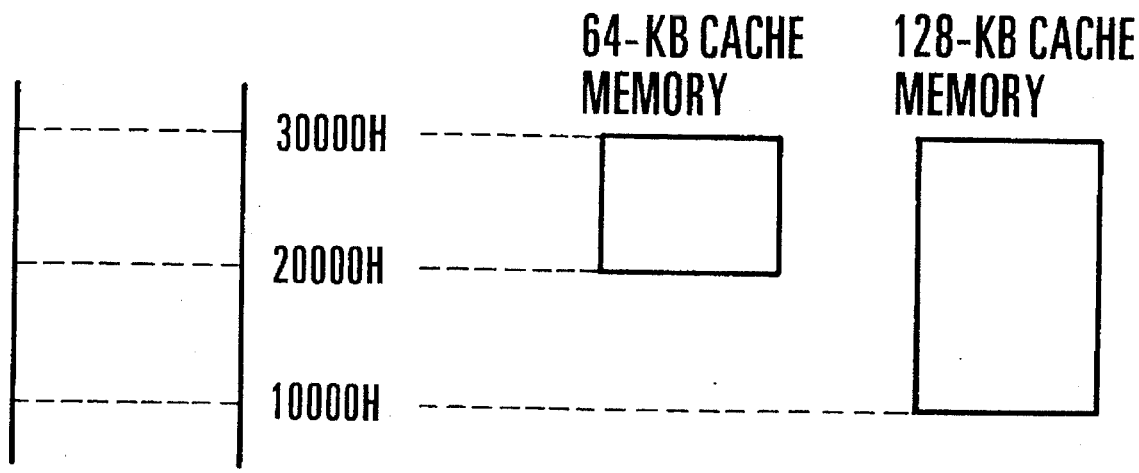
FIG. 5 is a view showing the relationship between the address area of a main memory used in the processing shown in FIG. 4 and the capacities of cache memories.

An embodiment of the present invention will be described in detail below. Note that a circuit arrangement for executing the present invention is the same as that shown in FIG. 3.

Cache memories mounted in an information processing apparatus, to which the present invention is applied, have four different capacities of 64 KB, 128 KB, 256 KB, and 512 KB, respectively.

A cache memory test method according to an embodiment of the present invention will be described with reference to FIG. 1.

Referring to FIG. 1, in step 101, cache disable processing is performed to disable the operation of a cache memory 302. In step 102, test data preparation is performed to cause a main memory 303 to store test data for testing the cache memory 302. As this test data, 512-KB data corresponding to the largest capacity of the capacities of the cache memories to be tested is formed.

This test data is set to have regularity in such a manner that each data value coincides with the lower two digits of a corresponding address. For example, a data value "00H" is set for address "10000H".

In step 103, a test program is copied in an area other than the cache application area and executed. More specifically, a cache memory test program is copied in an area other than the cache application area of the main memory 303, and is executed in this area other than the cache application area, thereby preventing the test program being erroneously written in the cache memory.

In step 104, cache enable processing is performed to enable the cache memory which as been set in an disabled state.

The operations in subsequent steps 101 to 104 are the same as those in steps 401 to 404 in the prior art.

In step 105, all test data is written. That is, access to the main memory 303 is made to read out the test data therefrom. With this operation, all the 512-KB test data is written in the cache memory 302, starting from the lower address.

Figure 2:
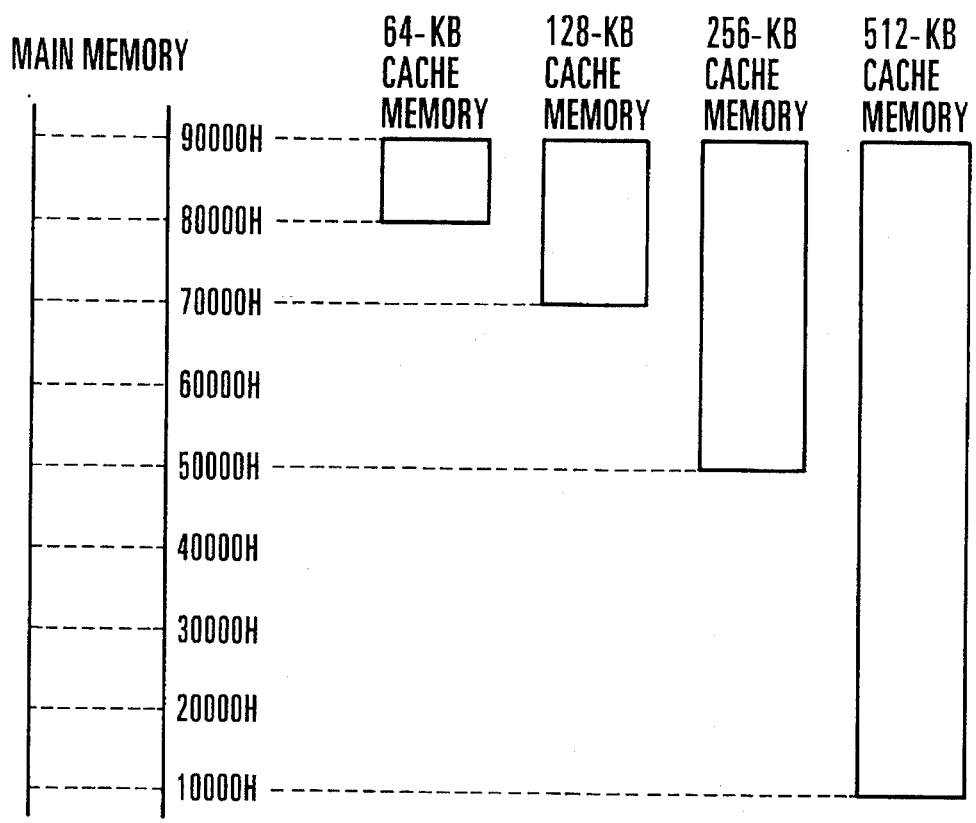
FIG. 2 is a view showing the relationship between the address area of a main memory used in the processing shown in FIG. 1 and the capacities of cache memories.

As shown in FIG. 2, when the 512-KB cache memory is used, all the 512-KB test data (corresponding to "10000H" to "8FFFFH") is written in the cache memory. If the 256-KB cache memory is used, only 256-KB test data at upper addresses ("50000H" to "8FFFFH") is written in the cache memory. If the 128-KB cache memory is used, only 128-KB data at upper addresses ("70000H" to "8FFFFH") is written in the cache memory. If the 64-KB cache memory is used, only 64-KB test data at upper addresses ("80000H" to "8FFFFH") is written in the cache memory.

Assume that the 256-KB cache memory is mounted in the apparatus. In this case, when 256-KB test data at lower addresses is written in the cache memory, the memory is filled to capacity. As the next data is written, the previously written data is sequentially erased upon an overwrite operation. Therefore, when all the data at the upper addresses corresponding to 512 KB is written in the cache memory, the test data at the upper addresses corresponding to 256 KB is eventually written in the cache memory. In the 128-KB cache memory, an overwrite operation is performed three times. In the 64-KB cache memory, an overwrite operation is performed seven times.

In step 106, a test data read operation is performed to access the main memory 303 so as to read out the test data therefrom, and it is checked whether a cache hit has occurred. In this case, start byte data of the test data is read out at a period corresponding to a cache transfer width (e.g., 16 bytes) to check whether a cache hit/mishit has occurred.

In this case, the capacity of a cache memory which can be mounted in the information processing apparatus is a multiple of 64 KB. For this reason, in performing a test, the area for the test data is divided into 64-KB areas.

In step 107, a cache hit/mishit information setting operation is performed to set a hit flag if a cache hit has occurred, and a mishit flag if a cache mishit has occurred. As described above, a cache hit/mishit is checked by reading out start byte data of the test data at the period corresponding to the cache transfer width. The check result is recorded on a cache hit/mishit information table in the main memory 303.

In step 108, it is checked whether the data has a normal value. If a cache hit is determined as a result of the above check, all the data corresponding to the cache transfer width are read out from the start byte data for which the cache hit is determined within this cache transfer width. When each data is read out, it is checked whether a cache hit has occurred and the read data value is normal. The operation in step 108, i.e., checking whether data has a normal value, can be easily performed because data is set to have regularity in such a manner that each data value coincides with the lower two digits of a corresponding address.

If NO in step 108, it indicates that a cache mishit or a data error has occurred. Therefore, it is determined that the cache memory has failed, and error processing is performed in step 112.

If YES in step 108, it is checked in step 109 whether 64-KB data is completely read out. If NO in step 109, the processing in steps 106 to 108 is repeated.

When data at addresses corresponding to 64 KB ("80000H" to "8FFFFH" in FIG. 2) is completely read out, YES is obtained in step 109. In step 110, it is checked whether both cache hits and mishits have occurred. In step 110, the cache hit/mishit information table formed in step 107 is referred to for every 64 KB to check whether cache hits or cache mishits have occurred in all data read operations performed at the period corresponding to the cache transfer width, or both cache hits and cache mishits have occurred.

Four types of cache memories which can be mounted in the information processing apparatus read out data in units of 64 KB. If, therefore, one of these four types of cache memories is mounted, cache hits occur in all data read operations performed at the period corresponding to the cache transfer width. If no such a cache memory is mounted, cache mishits occur in all data read operations.

If, therefore, a cache memory operates normal, it is improbable that a cache hit occurs in a given data read operation, and a cache mishit occurs in another data read operation. For this reason, if both cache hits and mishits have occurred, the cache memory has failed. Therefore, error processing is performed in step 112.

When cache hits have occurred in all data read operations performed at the period of the cache transfer width, it is confirmed that an area, of the cache memory area, on which the 64-KB data is copied is normal.

Subsequently, data in the next 64-KB area is checked.

In step 111, the memory capacity count value is incremented, and the read address position is incremented by 64 KB. With this operation, the number of times that the cache memory is tested for every 64 KB is counted. This count value is proportional to the capacity of the cache memory. Therefore, the capacity of the cache memory can be known from this count value.

After the read address position of the main memory is incremented by 64 KB in step 111, it is checked in step 113 whether the data read processing is completed or mishits have occurred in all data read operations. With this operation, it is confirmed that all tests for the capacity of the cache memory have been completed.

Assume that the 512-KB cache memory having the largest capacity is mounted in the information processing apparatus.

In this case, when the processing in steps 106 to 113 is repeated eight times, all tests are completed by using 512-KB test data. Therefore, YES is obtained in step 113 ("IS DATA READ OPERATION COMPLETED?"), and all the tests on the cache memory are completed.

As will be described below, when the 64-KB cache memory having the smallest capacity is mounted in the information processing apparatus, mishits occur in all data read operations for the next 64-KB test data. Therefore, YES is obtained in step 113 ("ALL MISHITS?"), and the tests on the cache memory are completed.

If any of the above cache memories is mounted in the information processing apparatus, YES is obtained in step 113 ("ALL MISHITS?"), the tests on the cache memory are completed. In this case, it is determined from the count value (e.g., one) in step 111 that no cache memory is mounted.

If NO is obtained in step 113, and the test on the cache memory is to be continued, the flow returns to step 106. The processing in steps 106 to 111 is then repeated. In this second processing, 64-KB test data at the next addresses ("70000H" to "7FFFFH" in FIG. 2) is read out. Subsequently, the processing in steps 106 to 111 is repeated.

If the 64-KB cache memory is mounted in the information processing apparatus, data at addresses "70000H" to "7FFFFH" are not copied in the cache memory. Therefore, cache mishits occur in all read operations in step 107, and YES is obtained in step 113. The test processing then ends. It is determined from the count value (e.g., two) that the cache memory mounted in the apparatus is the 64-KB cache memory.

If the 128-KB cache memory is mounted in the information processing apparatus, data at addresses "60000H" to "6FFFFFH" is not copied in the cache memory. Therefore, it is determined in step 107 that cache mishits have occurred in all data read operations, and YES is obtained in step 113. As a result, the test processing ends. It is determined from the count value (e.g., three) in step 111 that the cache memory mounted in the apparatus is the 128-KB cache memory.

Assume that the 256- or 512-KB cache memory is mounted in the information processing apparatus. In this case, if the cache memory is normal, it is determined in step 107 that cache hits occur in all data read operations. As a result, NO is obtained in step 113, and test data at the next addresses ("50000H" to "5FFFFH" in FIG. 2) corresponding to 64 KB. The processing in steps 106 to 111 is repeated for the fourth time.

If the cache memory is normal, it is determined in step 107 that cache hits have occurred in all data read operations. Furthermore, NO is obtained in step 113, and test data at the next addresses ("4000H" to "4FFFFH" in FIG. 2) corresponding to 64 KB is read out. The processing in steps 106 to 111 is repeated for the fifth time.

If the 256-KB cache memory is mounted in the information processing apparatus, data at addresses "40000H" to "4FFFFFH" is not copied in the cache memory. Therefore, it is determined in step 107 that cache mishits have occurred in all data read operations, and YES is obtained in step 113. As a result, the test processing ends. It is determined from the count value (e.g., five) in step 111 that the cache memory mounted in the apparatus is the 256-KB cache memory.

If the 512-KB cache memory is mounted in the information processing apparatus, all the remaining data at addresses "10000H" to "3FFFFH" is copied in the cache memory. Therefore, the processing in steps 106 to 111 is repeated for the sixth to eighth times. When the processing is performed for the eighth time, YES is obtained in step 113 ("IS DATA READ OPERATION COMPLETED?"), and the test processing ends. In this case, it is determined from the count value (e.g., nine) in step 111 that the cache memory mounted in the apparatus is the 512-KB cache memory.

In the above embodiment, in step 105 in FIG. 1, all the test data is read out from the main memory, starting from the lower address. However, the data may be read out, starting from the upper address.

In the above embodiment, in step 106, test address is read out from a cache memory in units of 64 KB, starting from the upper address. However, the data may be read out, starting from the lower address. In the embodiment shown in FIG. 1, the read address position is incremented by 64 KB in step 111. In this case, however, the read address position is decremented by 64 KB.

In the above embodiment, since the capacity of each of cache memories having different capacities increases/decreases in units of 64 KB, tests are performed for every 64-KB test data. However, tests may be performed for every 32- or 16-KB test data.

As is apparent, the present invention is not limited to the above embodiment, and various changes and modifications can be made within the spirit and scope of the invention.

As has been described above, according to the present invention, when cache memories having different capacities are mounted in an information processing apparatus, tests on the cache memories can be performed regardless of the capacities of the cache memories or whether the number of cache memories mounted is three or more.

Unlike the prior art, therefore, cache memories can be easily tested without setting signal lines indicating that cache memories are mounted or changing mechanical switched such as jumper strap switches in accordance with capacities.

What is claimed is:

1. A cache memory test method for an information processing apparatus including a main memory, a plurality of cache memories which have different memory capacities and are accessed at the same time when said main memory is accessed, and a determining circuit for, when data is read out from said main memory, determining a cache hit indicating that the data is read out from one of said cache memories, or a cache mishit indicating that the data is not read out from any one of said cache memories, comprising:

a first step of setting data for testing said cache memories in said main memory such that data values of the data have regularity;

a second step of loading the data from said main memory into each of said cache memories, the data being not less in amount than the capacity of each of said cache memories;

a third step of recording information indicating a cache hit indicating that the data is read out from one of said cache memories when said main memory is accessed to read out the data therefrom, or information indicating a cache mishit indicating that the data is not read out from any one of said cache memories, thereby forming a cache hit/mishit information table;

a fourth step of determining a normal/abnormal condition of each of said cache memories from a state of occurrence of cache hits and cache mishits indicated by the cache hit/mishit information table;

a fifth step of determining a normal/abnormal condition of each of said cache memories by checking, on the basis of the regularity, correctness of a data value with respect to data for which a cache hit is determined in the third step; and a sixth step of determining the capacity of each of said cache memories on the basis of an amount of data for which cache hits are determined in the third step.

2. A method according to claim 1, wherein in the third step, when the data is to be read out, data of a start byte at a period corresponding to a cache transfer width is read out.

3. A method according to claim 1, further comprising a seventh step of performing error processing when an abnormal condition is determined in one of the fourth and fifth steps.

4. A method according to claim 1, wherein the memory capacities of said cache memories correspond to integer multiples.

* * * * *